United States Patent [19]

Le Bris et al.

[11] Patent Number: 5,227,955
[45] Date of Patent: Jul. 13, 1993

[54] DISTRIBUTION BOX AND METHOD OF MANUFACTURING SUCH A BOX

[75] Inventors: Henri Le Bris, Antony; Marie N. Bonnetier, Bagneux, both of France

[73] Assignee: Souriau et Cie, Versailles Cedex, France

[21] Appl. No.: 780,193

[22] Filed: Oct. 22, 1991

[30] Foreign Application Priority Data

Oct. 29, 1990 [FR] France .................. 90 13382

[51] Int. Cl.⁵ ............................................. H02B 9/00
[52] U.S. Cl. ................................. 361/395; 174/52.1; 361/357; 361/398; 361/430; 439/76; 439/622
[58] Field of Search ............ 361/356, 357, 380, 395, 361/399, 398, 412, 413, 430–432, 332, 407; 174/52.1, 52.2; 439/76, 77, 620, 621, 622, 67, 85, 444

[56] References Cited

U.S. PATENT DOCUMENTS

| | | | |
|---|---|---|---|
| 3,590,330 | 6/1971 | Teagno | 361/357 |
| 4,135,226 | 1/1979 | Kourimsky | 361/415 |
| 4,688,149 | 8/1987 | Inoue | 361/399 |
| 4,689,721 | 8/1987 | Damerow | 361/388 |
| 4,944,684 | 7/1990 | Leibowitz . | |
| 5,040,996 | 8/1991 | Kobold et al. . | |

FOREIGN PATENT DOCUMENTS

| | | |
|---|---|---|
| 0388058 | 9/1990 | European Pat. Off. . |
| 3048451 | 7/1982 | Fed. Rep. of Germany . |
| 0749872 | 6/1956 | United Kingdom . |

*Primary Examiner*—Gerald P. Tolin
*Attorney, Agent, or Firm*—Larson & Taylor

[57] ABSTRACT

A distribution box has a housing carrying inlet and outlet connector sockets on two major faces and contains an internal printed circuit providing connections between the sockets and enabling the contacts of the connectors to be interconnected. The internal printed circuit is carried by two single-face boards placed back-to-back and interconnected by a flexible connecting circuit and the contacts of the connectors-and optionally of fuse-carriers placed on a single side of the board bearing the printed circuit are soldered in plate through-holes in the boards.

9 Claims, 2 Drawing Sheets

DISTRIBUTION BOX AND METHOD OF MANUFACTURING SUCH A BOX

BACKGROUND OF THE INVENTION

The present invention relates to distribution boxes of the type having a housing carrying inlet and outlet connector sockets on two major faces and containing an internal printed circuit providing connections between the sockets and enabling the contacts of the inlet and outlet connectors to be interconnected in a manner determined by the layout of the internal circuit.

The invention is particularly — but not exclusively — suitable for use in road assemblies, and in particular in road assemblies comprising a tractor unit and a trailer or a semi-trailer. In such assemblies, a distribution box is used for distributing information delivered by one or more inlet connectors to various different locations. The information signals, such as currents directed to lighting lamps, leave the box via outlet connectors feeding separate cables.

At present, use is typically made of distribution boxes having a circuit carried by a board that is printed on both faces and by connector sockets that are embedded in an insulating material. Although the contacts of the connector sockets located on one side of the board can be connected easily by using the cheap flow soldering process, the contacts placed on the other side must be soldered manually which gives rise to high manufacturing costs. In addition, prior distribution boxes do not have fuses, which makes it necessary to rely on the general fuses mounted on the tractor unit to the detriment of safety and ease of locating a faulty circuit.

SUMMARY OF THE INVENTION

It is an object of the present invention to provide a distribution box of lower cost than that of present boxes to perform the same functions and/or capable of performing additional functions at a cost that is comparable or lower.

To this end, there is provided a distribution box comprising two mutually abutting plates and is filled with an insulating potting material; the internal printed circuit carries a fuse-carrier on one face with the fuses being accessible from outside the housing via an opening in one of the plates, which opening is closable by a removable cover, thereby making fuse replacement easy.

The printed circuit may be printed on one face only or on both faces; it may be flexible (e.g. of the "Ben Flex" type). The fuse-carriers are advantageously placed on one side of the card only, facing one of the plates only.

This arrangement makes it possible to associate a fuse with each of the circuits powered, to identify a faulty circuit easily, and to easily replace a fuse that has blown after repairing the faulty circuit.

There is also provided a distribution box wherein the internal printed circuit is carried by two single-face boards placed back-to-back and interconnected by a flexible connecting circuit and the contacts of the connectors-and optionally of fuse-carriers-placed on the single side of the carrying board carrying the printed circuit are soldered in plated through-holes in the boards.

This arrangement makes it possible to make all of the required electrical connections by the cheap flow soldering process.

The invention will be better understood from the following description of a distribution box constituting a particular embodiment of the invention and given by way of non-limiting example. The description refers to the accompanying drawings.

DETAILED DESCRIPTION

The distribution box as shown is suitable for distributing information in electrical form delivered by an inlet cable to outlet cables. Such a distribution box is particularly suitable for use on a trailer unit to feed electrical currents of various values to different locations, the distribution being determined by the layout of the printed circuit that the box contains. In addition to means for distributing electricity, the box may also include means for distributing optical signals to optical fiber cables.

The box as shown is flat in shape. It comprises a housing made of two approximatively rectangular plates 10 and 12 having interfitting flanges enabling the plates to be assembled together and defining a waterproof cavity. The two plates are advantageously held together by resilient catches 14 carried by one of the plates and snap-fastened to the other. The distribution box also has fixing holes 16.

Figure 1:
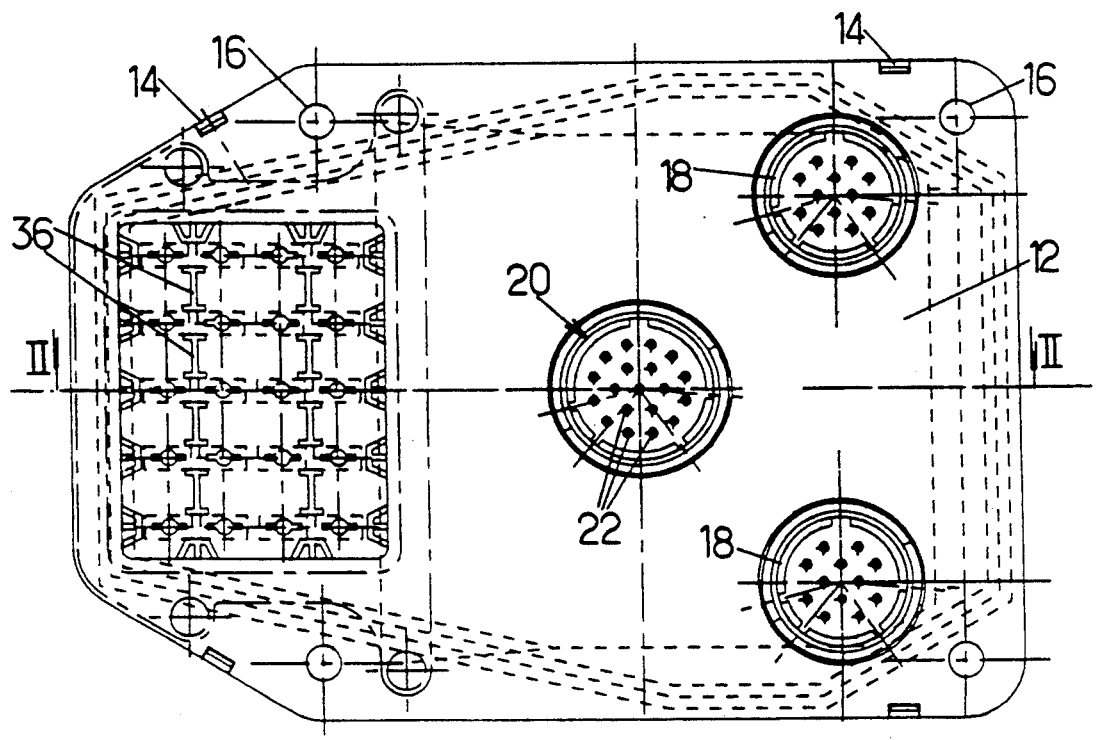
FIG. 1 is a front view of a distribution box, with the protective cover for the fuses, the fuses themselves, and the fuse-carrier removed.
Figure 2:
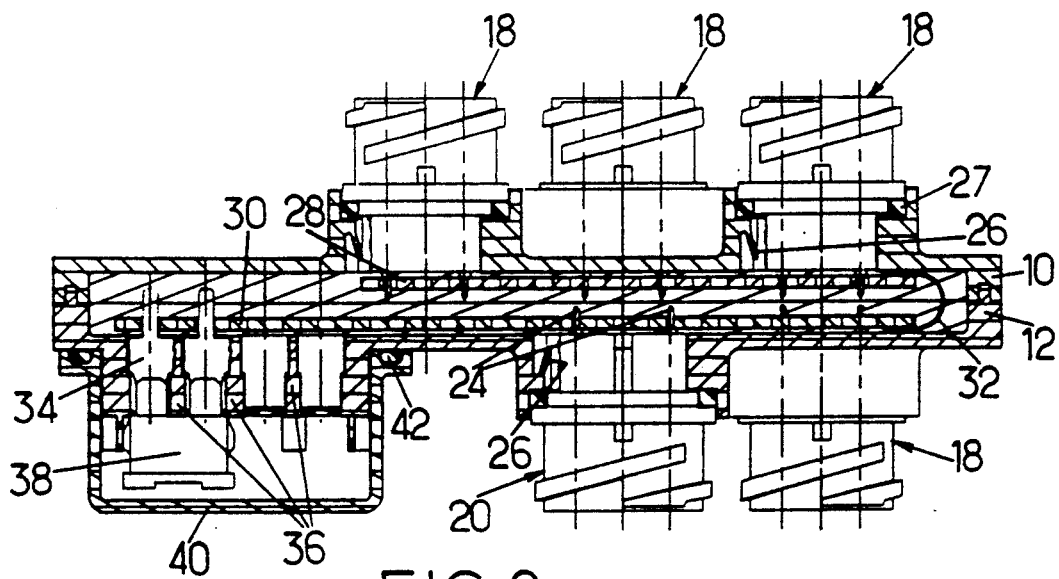
FIG. 2 is a sectional view along line II-II of FIG. 1, with a single fuse being shown.
Figure 3:
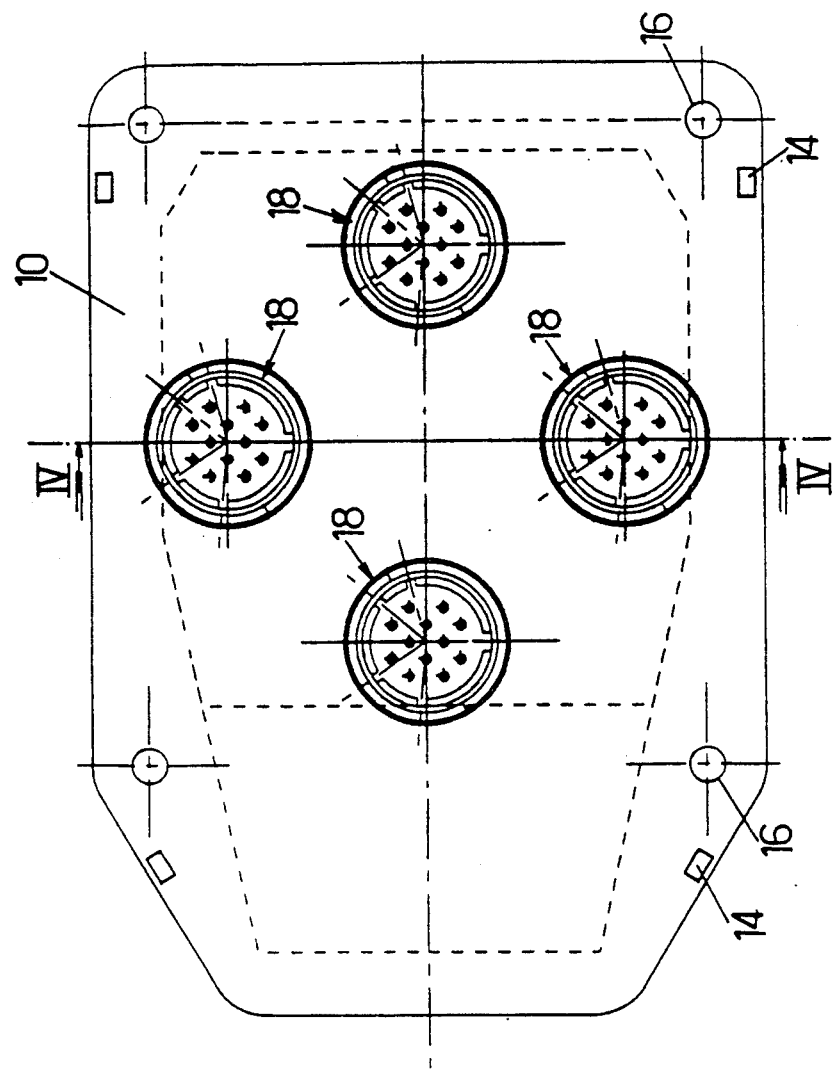
FIG. 3 is a rear view of the box.
Figure 4:
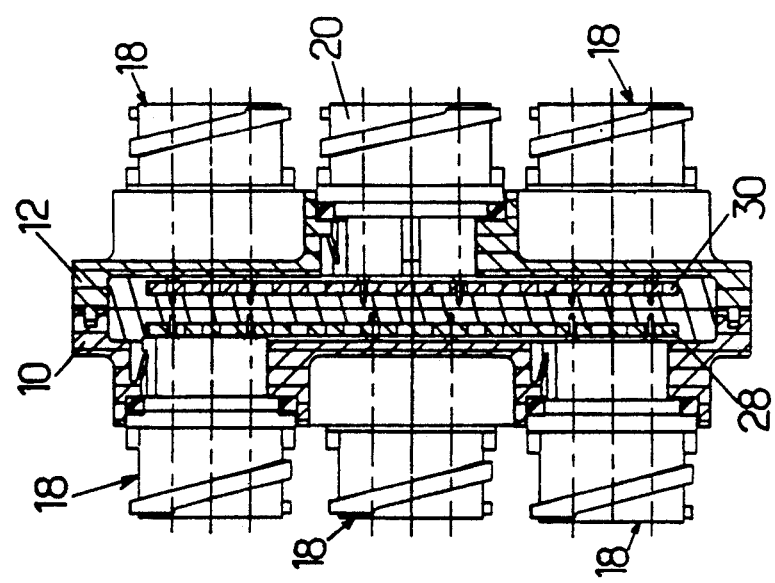
FIG. 4 is a sectional view along line IV-IV of FIG. 3.

The two plates have outwardly-directed tubular projections each intended to receive a connector socket. For reasons of cost, the socket may be constituted by a body of thermo-plastic material (reinforced polybutylene, for example) in which machined copper alloy contacts 22 are press-fit, in the outlet connector sockets 18 and inlet connector sockets 20. Each of the contacts is extended towards the inside of the housing by a spike or pin such as the spikes labelled 24 in FIG. 2. When the housing is to be filled with a solidified potting material, as is generally the case, the bodies of the sockets may be simply held by resilient fingers 26 until the box is fully assembled.

A sealing ring 27 is interposed between a flange of each socket and a shoulder on the projection that receives it, thereby providing sealing. The sealing ring is kept under compression by the resilient fingers 26 that retain the socket. The connectors are advantageously of the type having a locking ring with a coarse pitch helical ramp, and with a "hard point" or snap action at the end of the locking stroke for safety. For instance, connectors of the type described in document EP-A-0 346 234 may be used.

The housing contains a printed circuit carried by two single-face boards 28 and 30 placed back to back and interconnected by a flexible circuit 32 provided with end contacts that are suitable for soldering to the boards. The structures of the printed circuits and of the flexible circuit determine how the electrical information received from the inlet connector is distributed between the outlet connectors.

In the embodiment shown in FIGS. 1 to 4, the two boards are of different lengths. This facilitates installation of fuse-carriers 34 on the portion of the longer board 30 that projects beyond the shorter board 28. The opening is advantageously sub-divided by partitions 36 so as to separate the fuse-carriers from one another for safety reasons and to hold them in place for soldering.

This arrangement makes it possible to place fuses 38 that are accessible from the outside under a closure cover 40 which is held in place by means (not shown), such as a central screw. A sealing gasket 42 is interposed between the cover 40 and the plate 12 to ensure that the box is sealed.

The box may be manufactured by the following method.

The plates 10 and 12 are made of insulating material, generally a thermoplastic material which does not need to be of such a high quality as that used to make the bodies of the sockets. The sockets 18 and 20 provided with their sealing rings 27 are pushed home until they are held in place by the resilient fingers 26 snapping behind them. The fuse-carriers 34 are installed through the opening provided in the plate 12 (with the cover 40 removed). The two printed circuit boards 28 and 30 are laid out flat and the plates 10 and 12 are mounted separately on the boards so that the spikes on the sockets and on the fuse-carriers carried by the plates are received in plated through-holes 35 provided to receive them in the boards 28 and 30.

The assembly made up in this way is flow soldered, thereby fixing the spikes 24 of the sockets and the spikes of the fuse-carriers 34 in a single operation; the flexible circuit 32 may be mounted separately or its contacts may also be flow soldered.

Once soldering has been completed, the two plates 10 and 12, each containing one of the boards, are folded onto each other like closing a wallet and they are engaged with each other while checking that the locking clamps or fingers 14 are properly in place.

To make the box waterproof, the internal contacts may be potted in a hardenable insulating substance. During an initial step, the housing may be held in vertical position and the potting substance may be poured in liquid condition up to the top of the shorter board. The housing is then laid flat and potting is completed while taking care to avoid overflowing onto the fuse-carriers.

An extremely robust integral assembly is thus provided which is just as good at withstanding water seepage and splashing as a box in which the contacts are embedded directly in the box, but at a much lower cost. In particular, there is no difficulty in making a box which is proof against a jet of water under a pressure of 150 Bars as is required for motor vehicle applications.

The invention is not limited to the particular embodiments shown and described by way of example. Numerous modifications are possible, as regards the kinds of connectors used and the possible applications of the box.

We claim:

1. A distribution box having:
   a housing comprising a pair of mutually confronting and abutting plates connected to each other and defining an inner volume;
   inlet and outlet connector sockets carried by and traversing respective major faces of said plates, each having contacts projecting into said inner volume;
   printed circuit means located in said inner volume and having plated through-holes receiving said contacts in said inlet and outlet connector sockets, whereby said printed circuit means interconnects said contacts;
   fuse carrier means located in said volume, having connecting spikes carried by said printed circuit means on one face thereof at a location confronting a closable access opening in one of said plates; and
   insulating potting material filling said volume except at the location of said fuse carrier means, wherein said access opening is divided by partitions belonging to said one of said plates and separating individual fuse carriers of said fuse carrier means.

2. A distribution box having:
   a housing comprising a pair of mutually confronting and abutting plates connected to each other and defining an inner volume;
   inlet and outlet multi-contact connector sockets carried by and traversing respective major faces of said plates, and
   a pair of single face printed circuit boards which are placed back-to-back in said inner volume and are interconnected by a folded flexible connecting circuit and wherein all contacts of the connector sockets are soldered in plated through-holes on said boards, whereby said printed circuit boards and flexible connecting circuit interconnect said contacts of said sockets.

3. A distribution box according to claim 2, further comprising a plurality of fuse carriers carried by only one of said boards, at a location accessible through an opening of one of the plates closable by a water tight cover, and having connecting pins soldered in plated through-holes of said one of said boards.

4. A distribution box according to claim 3, wherein said fuse carriers are soldered on a portion of said one of said boards which extends beyond the other board, at an end which is opposed to an end connected to the other board by the flexible connecting circuit.

5. Box according to claim 2, wherein said sockets are fastened to said plates and wherein the contacts of said socket project through the boards and are soldered to said printed circuit on those faces of the boards which are facing each other.

6. Box according to claim 1, further comprising resilient fingers integral with one of the plates and snapped on the other plate for retaining the plates in assembled condition.

7. A distribution box having:
   a housing comprising a pair of mutually confronting and abutting plates connected to each other and defining an inner volume;
   inlet and outlet connector sockets carried by and traversing respective major faces of said plates;
   an internal printed circuit located in said inner volume and interconnecting contacts in said inlet and outlet connector sockets;
   fuse carrier means located in said volume, carried by said internal printed circuit on one face thereof at a location confronting a closable access opening in one of said plates; and
   insulating potting material filling said volume except at the location of said fuse carrier means;
   wherein each said socket is received in a tubular boss of a respective one of said plates and is retained by resilient fingers of the plates or sockets in a position where it compresses a sealing joint located between a flange of the respective socket and the respective plate.

8. Process for manufacturing a distribution box having:
- a housing comprising a pair of mutually confronting and abutting plates connected to each other and defining an inner volume;
- inlet and outlet connector sockets carried by and traversing respective major faces of said plates;
- an internal printed circuit located in said inner volume and interconnecting contacts in said inlet and outlet connector sockets, wherein said internal printed circuit is carried by a pair of single-boards which are connecting circuit and wherein contacts of the connectors are soldered in plated through-holes on said boards, comprising the steps of:

providing a sealing joint on each of the sockets;
forcing the sockets into respective ones of said plates until they are in connected condition;
mounting said plates on said boards while said boards are extended in such a position that the pins of the socket contacts projet through holes in the boards for forming a unit,
wave soldering said unit; and
folding the plates onto each other and fastening the plates to each other.

9. Process according to claim 8, further comprising the step of filling the housing with an electricity insulating potting product.

* * * * *